United States Patent
Clark et al.

[11] Patent Number: 5,859,450
[45] Date of Patent: Jan. 12, 1999

[54] DARK CURRENT REDUCING GUARD RING

[75] Inventors: Lawrence T. Clark, Phoenix; Mark A. Beiley, Chandler, both of Ariz.

[73] Assignee: Intel Corporation, Santa Clara, Calif.

[21] Appl. No.: 941,800

[22] Filed: Sep. 30, 1997

[51] Int. Cl.⁶ .................................................. H01L 27/148
[52] U.S. Cl. .......................... 257/233; 257/446; 257/452; 257/459; 257/461
[58] Field of Search .................................. 257/290, 291, 257/233, 443, 446, 452, 459, 461

[56] References Cited

U.S. PATENT DOCUMENTS

| | | | |
|---|---|---|---|
| 4,096,622 | 6/1978 | MacIver | 29/578 |
| 4,137,109 | 1/1979 | Aiken et al. | 148/175 |
| 4,261,095 | 4/1981 | Dreves et al. | 29/571 |
| 4,414,737 | 11/1983 | Menjo et al. | 29/578 |
| 4,507,853 | 4/1985 | McDavid | 29/591 |
| 4,549,914 | 10/1985 | Oh | 29/571 |
| 4,656,732 | 4/1987 | Teng et al. | 29/591 |
| 4,691,435 | 9/1987 | Anantha et al. | |
| 4,722,910 | 2/1988 | Yasaitis | |
| 5,221,856 | 6/1993 | Decker et al. | 257/518 |

*Primary Examiner*—Minh Loan Tran
*Attorney, Agent, or Firm*—Blakely, Sokoloff, Taylor & Zafman LLP

[57] ABSTRACT

A photodiode is provided. The photodiode includes an insulative region (IR) that permits passage of light therethrough. The photodiode also includes a substrate region of a first conductivity type and a well region of a second conductivity type. The well is formed within the substrate, beneath the IR. The well is demarcated from the substrate by a first surface. The photodiode further includes a heavily doped region (HDR) of the second conductivity type. The HDR is formed within the IR at a first position. The first surface meets the HDR at substantially the first position.

23 Claims, 5 Drawing Sheets

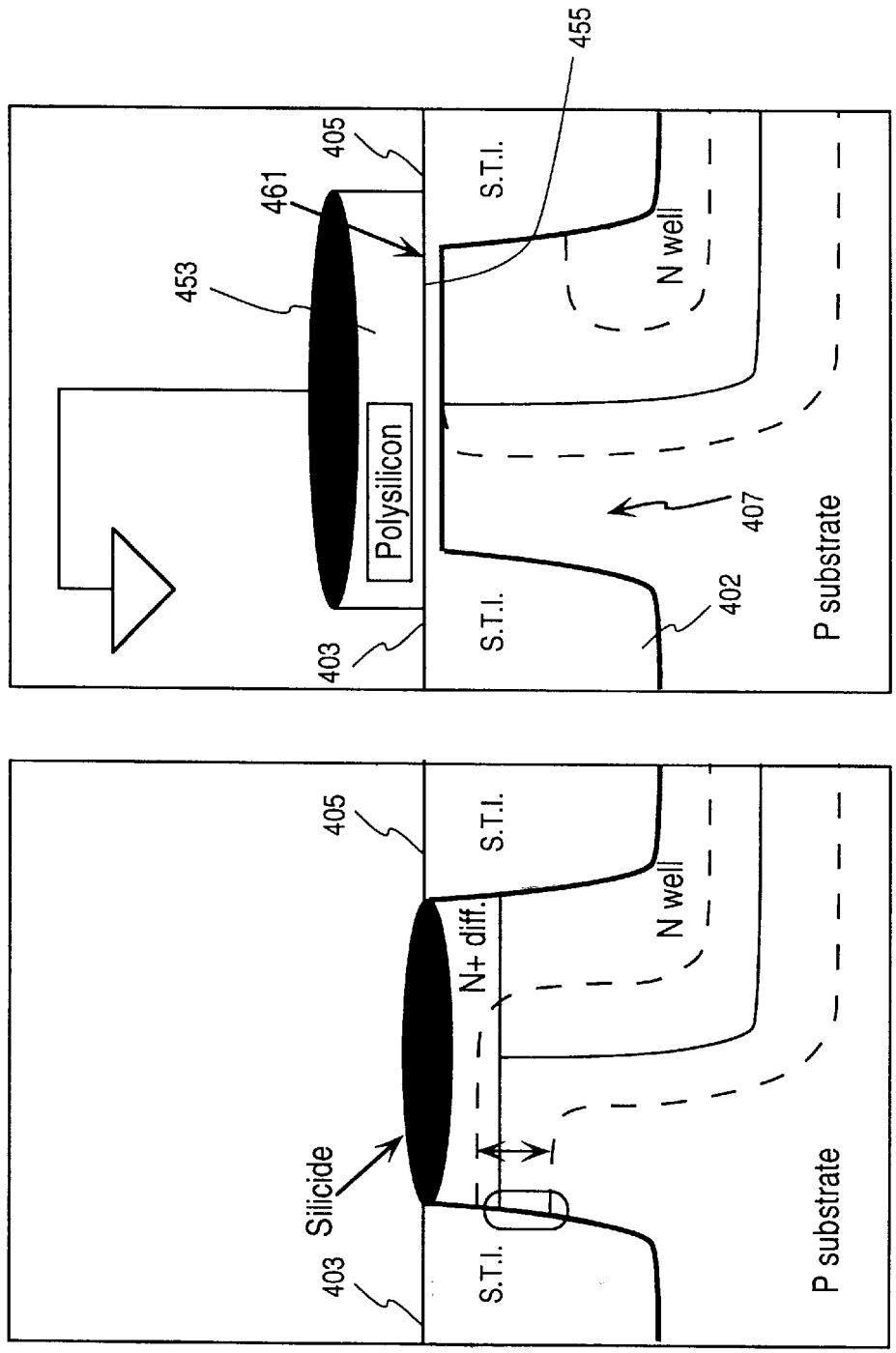

//  5,859,450

DARK CURRENT REDUCING GUARD RING

BACKGROUND OF THE INVENTION

(1) Field of the Invention

The present invention generally relates to photo detecting semiconductor structures. More particularly, the present invention relates to photodiodes built using modern state-of-the-art complimentary metal oxide semi-conductor (CMOS) fabrication processes.

(2) Background Information

A key component of imaging systems is a photodiode detector—a device used to detect incident photons of visible light that originate from an object that has an image to be captured. The photodiode is exposed to incident light which travels through a transparent oxide isolation layer thereof and into a silicon region thereof that may include a P-N junction. When the P-N junction diode is reverse biased, a depletion region may be formed and electron-hole pairs are generated both inside and outside the depletion region in response to incident photons of visible light impinging onto the transparent oxide isolation layer. The photo generated electron-hole pairs are swept away by diffusion and drift mechanisms and collected in the depletion region, thereby inducing a photo current representing a portion of the image to which the photodiode was exposed.

A significant factor contributing to a sensitivity of a photodiode is its ability to capture as many incident photons as possible. The sensitivity of the photodiode is affected in part by dark current which is the amount of reverse-bias diode leakage current induced in the photodiode when the photodiode is in the dark, i.e., current that is not induced by light. Dark current is particularly generated at an interface between the transparent isolation layer and the depletion region. The dark current causes noise in the signal generated in response to the exposure of the photodiode to light. Excessive dark current may also cause the readout dynamic range to be reduced. Efforts are made to minimize the dark current thereby reducing the noise in the signal detected and preserving the readout dynamic range.

It is desirable to decrease the amount of dark current generation at the interface between a depletion layer and transparent isolation region of a photodiode.

SUMMARY OF THE INVENTION

A photodiode is provided. The photodiode includes an insulative region (IR) that permits passage of light therethrough. The photodiode also includes a substrate region of a first conductivity type and a well region of a second conductivity type. The well is formed within the substrate, beneath the IR. The well is demarcated from the substrate by a first surface. The photodiode further includes a heavily doped region (HDR) of the second conductivity type. The HDR is formed within the IR at a first position. The first surface meets the HDR at substantially the first position.

BRIEF DESCRIPTION OF THE DRAWINGS

The features, aspects, and advantages of the present invention will become more fully apparent from the following Detailed Description, appended claims, and accompanying drawings in which:

FIGS. 4a and 4b illustrate first and second embodiments of a photodiode according to the present invention;

DETAILED DESCRIPTION

In the following description, numerous specific details are set forth to provide a thorough understanding of the present invention. However, one having ordinary skill in the art should recognize that the invention can be practiced without these specific details. In some instances, well-known circuits, structures, and techniques have not been shown in detail to not unnecessarily obscure the present invention.

Figure 1:
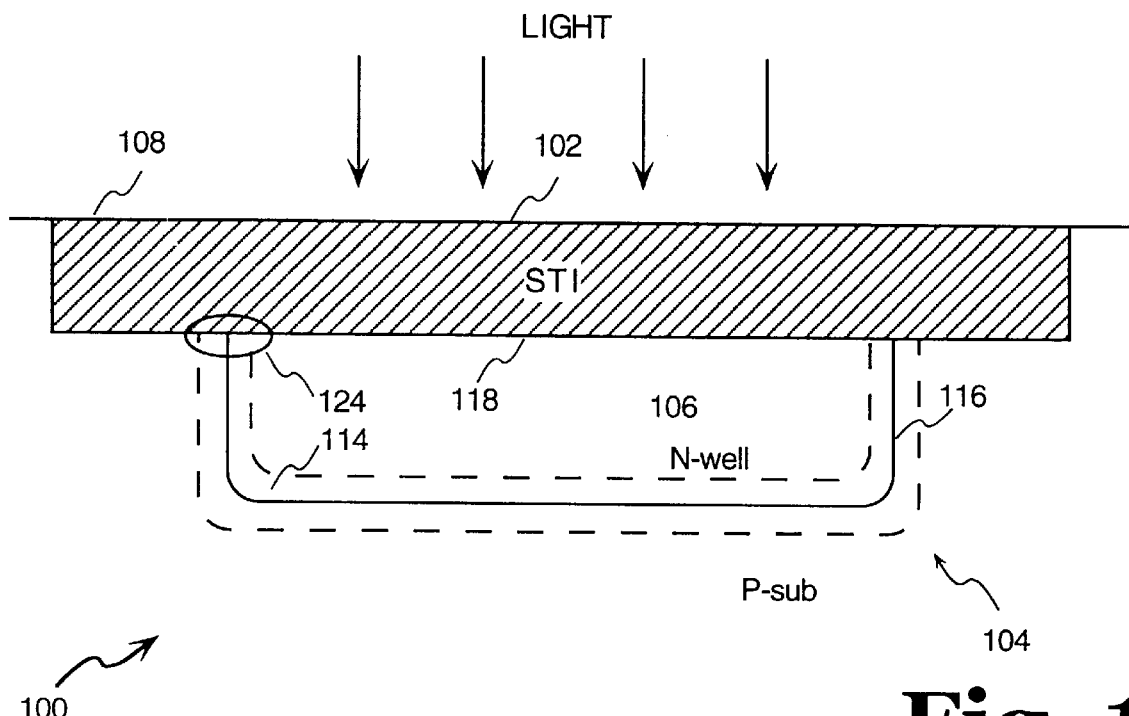
FIG. 1 illustrates a cross-sectional view through one embodiment of a photodiode according to the present invention.

FIG. 1 illustrates a cross-sectional view through a diode photo receptor (hereinafter "photodiode") 100. Photodiode 100 includes a semiconductor substrate 104. The substrate 104 has a N-well region 106 formed therein. Furthermore, photodiode 100 has a shallow trench isolation (STI) region 102. When a P-N junction, formed between the substrate 104 and the well 106, is reverse biased, a depletion region 114 is formed at a vicinity of a surface 116 demarcates the N-well 106 from the P-substrate 104.

Dark current is particularly generated at an interface between the STI and depletion region 114. Since the STI 102 is wider than the N-well 106, an interface 124 between the depletion region 114 and STI 102 is formed at a bottom surface 118 of the STI 102. It has been found that generation/recombination of electron-hole pairs is increased at the bottom surface 118 of the STI. It is believed that the cause of increased generation/recombination at the bottom surface 118 of the STI is caused by damaged areas, existent at the bottom surface of the trench and caused by a process of etching the STI. Such process is performed to obtain the shallow trench. After the etching process takes place, residue, particularly carbon, is left at the bottom of the trench.

Figure 2:
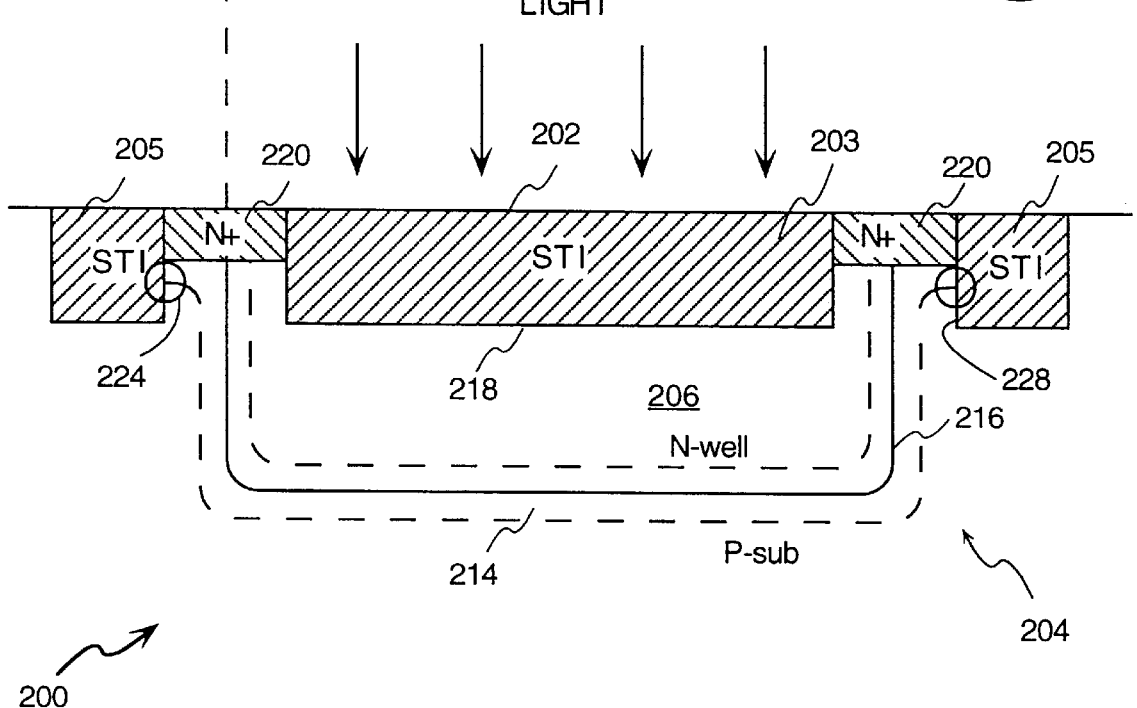
FIG. 2 illustrates a cross-sectional view through one embodiment of a photodiode with a guard ring according to the present invention.

FIG. 2 illustrates a cross-sectional view through one embodiment of a photodiode 200, with a heavily doped region 220, according to the present invention. Photodiode 200 may be part of a CMOS image sensor that may be made by way of a modern silicon CMOS fabrication process such as a process designed to fabricate microprocessors. Moreover, the CMOS image sensor may be part of a CMOS active pixel sensor array that is known in the art. Furthermore, the CMOS active pixel sensor array may be used in connection with an imaging system such as a digital camera or a video device.

Photodiode 200 much in the same way as the embodiment of the photodiode of FIG. 1, includes a silicon substrate region 204 that has a first conductivity type and a well region 206 formed in the silicon substrate. The well region has a second conductivity type. In one embodiment of the present invention described herein substrate region 204 includes a P-type silicon substrate and well region 206 includes a N-type silicon well. It should be understood that the embodiment of the present invention described herein may be as well implemented with a N-type substrate and a P-type well. In one embodiment of the photodiode according to the present invention, well 206 may be formed by ion implantation of substrate 204 or any other well-known processes for making a well.

Photodiode 200 further includes electrically insulative region (dielectric) 202, that is formed on top of the N-well 206. This dielectric region is transparent to light permitting passage of light therethrough. Dielectric region 202 is formed by etching a shallow trench at the top of the substrate. The shallow trench is then filled with oxide ($SiO_2$) thereby forming a shallow trench isolation (STI) region (shown in hashed lines that form an acute angle with respect to a horizontal direction). Shallow trenches and processes of making of these trenches are well-known to persons skilled in the art.

The shallow trench has a width (in a horizontal direction) larger than a width (in a horizontal direction) of N-well 206 thereby covering N-well region 206. N-well 206 is defined by N-well surface 216 that demarcates (separates) N-well 206 from P-substrate 204. When the N-well and the P-substrate are reverse biased, a diode depletion region is formed across and near the P-N junction. More specifically, the diode depletion region is formed across and near surface 216 (first surface) that demarcates N-well 206 from substrate 204. After applying a correct reverse-bias voltage to the photodiode, a photo current may be induced in diode depletion region 214 in response to the transmitted light incident to the STI.

The embodiment of the photodiode 200 of the present invention described herein also includes heavily doped region (HDR) (hereinafter referred to as "guard ring") 220 formed within STI 202. HDR 220 has a second conductivity type N, and since it is heavily doped, HDR 220 is N+. The shape of the guard ring 220 may have any closed-loop type of shape that separate STI 202 in two regions: internal region 203 and external region 205. In one embodiment according to the present invention, STI 202 has a rectangular shape, internal region 203 has a rectangular shape, and guard ring 220 has an annular-rectangular shape as illustrated in FIG. 5 described later in this description.

In one embodiment of the photodiode 200 of the present invention, guard ring 220 is formed in STI 202 by etching a portion of the STI 202 at and around a first position defined by dotted line 222. Guard ring 220 is formed in the etched portion. Guard ring 220 is then subjected to the process of ion implantation to obtain the heavily doped guard ring 220. The first position 222 may be defined as the position where surface 216, that demarcates N-well 206 from substrate 204, would meet the bottom surface 218 of the STI 202 had guard ring 220 not been formed within STI 202. Guard ring 220 is thus formed so that surface 216 meets (intersects) a bottom surface of the guard ring at a position substantially close to the first position. It is preferable that guard ring 220 is formed in STI 202 so that surface 216 intersects the bottom surface of the guard ring at a median position on the guard ring.

The presence of N+ doped guard ring 220, at the first position, causes depletion region 214 to interface with STI 202 at a lateral inner surface 228 of external region 205 as opposed to the bottom surface 218 of STI 202. The guard ring 220, thus, shapes the way the depletion region 214 makes contact with the STI 202. Termination of depletion region 214 onto lateral surface 228 of the STI 202 is preferable to termination of depletion region 214 onto bottom surface 218, because lateral surface 228 has been determined to be cleaner (e.g., it includes less silicon damage and residue than bottom surface 218 of the STI). A cleaner interface area, between depletion region 214 and surface 228, causes less generation/recombination of holes and electrons at the interface of the depletion region with the STI and thus less generation of dark current. Moreover, since the area of contact 224, at lateral surface 228, is inversely proportional with the doping of guard ring 220, guard ring 220 causes a smaller area of contact between the depletion region 214 and the STI, than in the case where the depletion region 214 intersects bottom surface 218 of the STI.

Guard ring 220 moves the depletion region away from the bottom of the STI to the lateral surface 228 of the STI. Guard ring 220 causes a reduction in the area of contact between the depletion region and the STI due to retrograde p-well doping, i.e., p doping is higher near the surface. Therefore, guard ring 220 contributes to a decrease of the dark current in the embodiment of the photodiode according to the present invention.

Figure 3A:
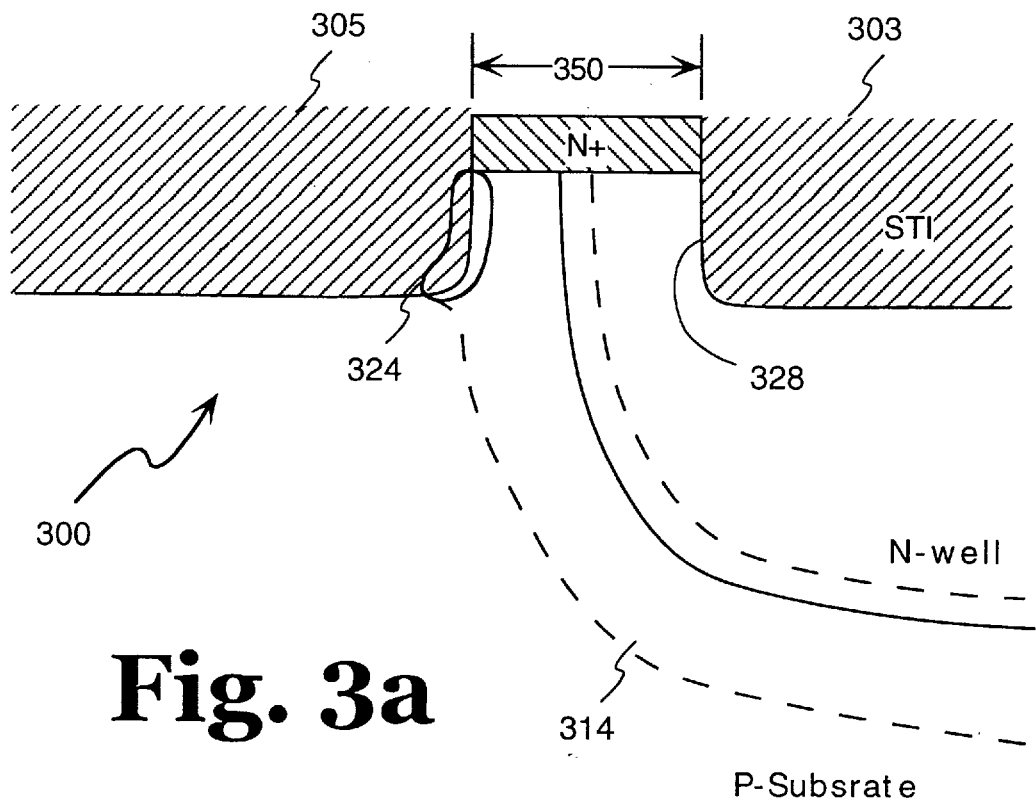
FIGS. 3a and 3b illustrate cross-sectional views through two embodiments of the photodiode according to the present invention each having guard rings of different widths.
Figure 3B:
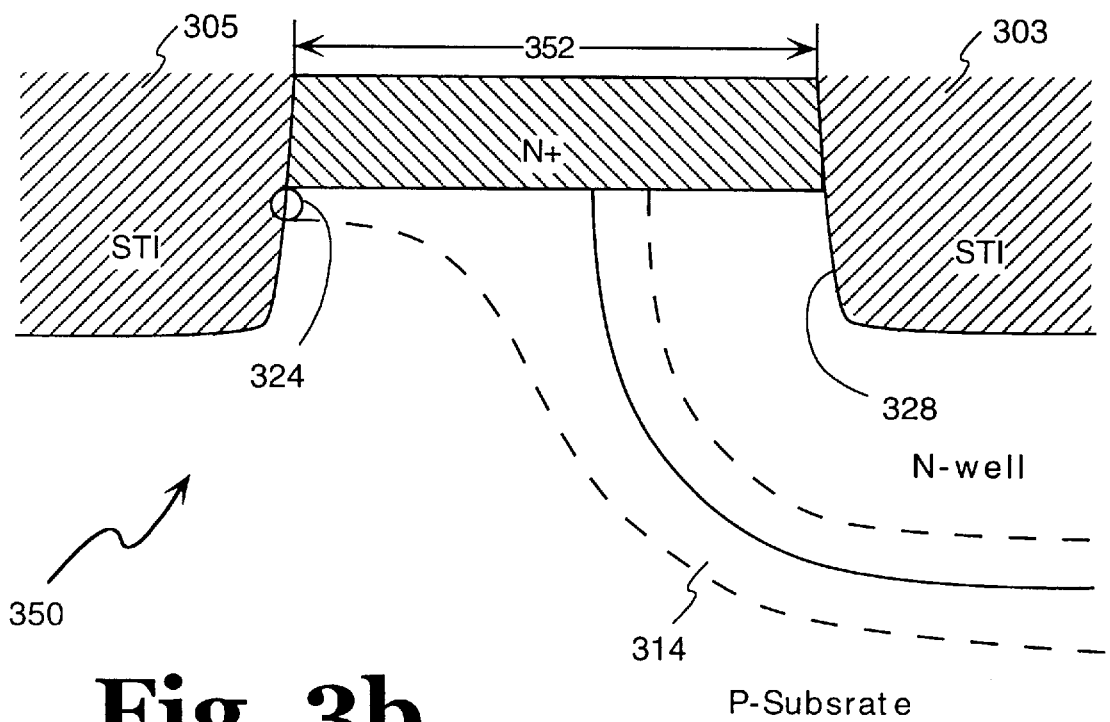

FIGS. 3a and 3b illustrate cross-sectional views through portions of one embodiment of the photodiode according to the present invention where the widths of the guard ring are different. FIG. 3a of the embodiment shown has a guard ring with a width 350 that is smaller than a width 352 of the guard ring of the embodiment illustrated in FIG. 3b. An interface between the depletion region 314 and the lateral surface 328 of the STI is larger for a guard ring with a narrower width 350 (FIG. 3a) than for a guard ring with a larger width 352 (FIG. 2b). Accordingly, the wider the guard ring the lesser the area of interface of the depletion region with the STI and the lesser the dark current generated around that area.

While wider guard rings are preferable, due to the smaller interface at lateral surface 328 of the STI, the wider the guard ring the smaller is the optical sensing area, i.e., the internal region 303 of the STI. Accordingly, the wider the dark ring, less dark current is generated but the sensitivity of the diode is reduced due to the smaller optical sensing area. Therefore, for any given process, an optimal value may be determined taking into account the sensitivity and the dark current of the photodiode.

FIGS. 4a and 4b illustrate first and second embodiments of a photodiode according to the present invention. The guard ring of the embodiment of FIG. 4a is substantially similar to the guard ring of the embodiment described above. The embodiment of FIG. 4b has a portion 407 defining an internal portion 405 and an external portion 403. However, instead of a N+ heavily doped guard ring, a gate oxide guard ring 455 is formed between regions 403 and 405. A layer of polysilicon gate 453, over thin oxide 461, is formed over the STI region between the internal and external regions 405 and 403 respectively. The layer of polysilicon is silicided and coupled to ground. Note that the silicon interface within the N-well is inverted as the gate voltage is at 0 volts and the well voltage is positive during operation. The depletion region is terminated on high quality gate-oxide regions. The gate-oxide region has high quality to satisfy good MOSFET operation.

Figure 5A:
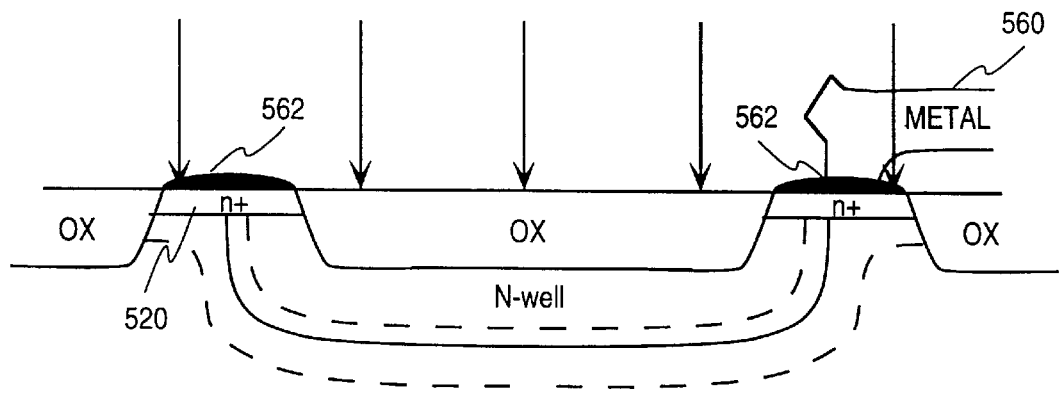
FIG. 5a illustrates a cross sectional view through an embodiment of photodiode according to the present invention with a metal contact coupled thereto.

FIG. 5a illustrates a cross sectional view through an embodiment of photodiode according to the present invention with a metal contact 560. The N+ guard ring also plays the role of ohmic contact to the photodiode's well because the N+ region is conductive. The silicided region 562, on top of the guard ring 520, is conductive too and is typically coupled to a metal contact 560 that biases the photodiode. The metal contact 560 is coupled to a pixel node 618 that is shown hereinafter in FIG. 6.

Figure 5B:
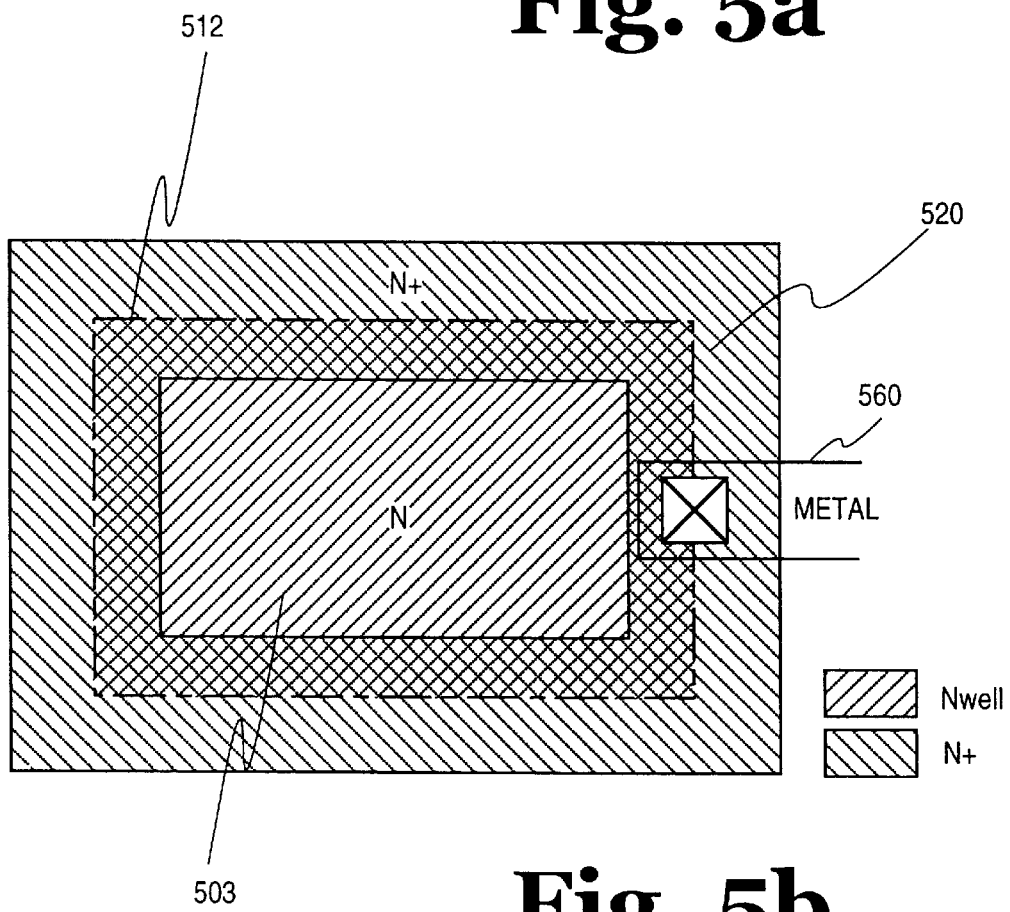
FIG. 5b illustrates an exemplary layout of a CMOS photodiode according to the present invention.

FIG. 5b illustrates an exemplary layout of a CMOS photodiode according to the present invention illustrated in FIG. 5. The guard ring 520 surrounds the inner photosensitive portion 503 of the photodiode. The N-well includes the portion limited by the dotted line 512. The metal contact 560 contacts the N+ guard ring 520 for biasing the photodiode according to the present invention.

Figure 6:
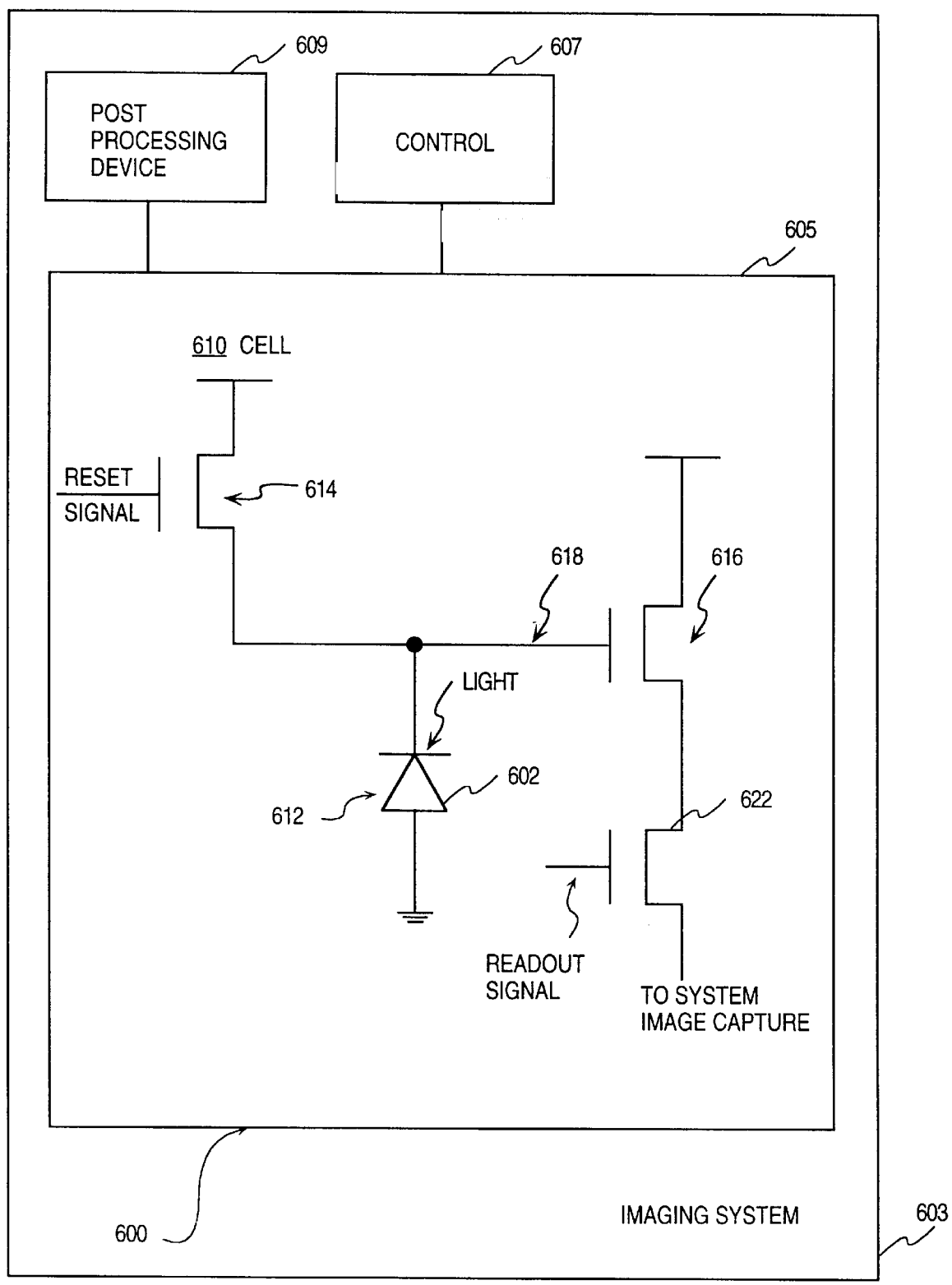
FIG. 6 illustrates a possible implementation of a photo cell circuit that includes one embodiment of the photodiode according to the present invention.

FIG. 6 illustrates a possible implementation of an imaging system 603, such as a digital camera or a video device, with an active pixel sensor cell circuit 600 that includes one embodiment of the photodiode 602 according to the present invention. The active pixel sensor cell may be included in a CMOS active pixel sensor array 605. The imaging systems 603 may also include a control device 607 coupled to the array 605 and a post processing device 609 coupled to both the array and to the control device 607.

The active pixel sensor cell 600 includes a reset transistor 614 and a source follower device 616. The reset transistor 614 selectively resets a pixel node 618 to a predetermined voltage. When a readout signal is asserted to row switch transistor 622, the source follower 616 provides a voltage related to the voltage at the pixel node 618 to an image capture system (not shown). Incident light causes pixel node 618's voltage to drop by collection of electrons photogenerated in the depletion region of the diode. The photodiode 602 according to the present invention including the guard ring explained in the foregoing minimizes the negative effect of the dark current as this current is substantially reduced by the above guard ring explained in the foregoing.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A photodiode comprising:
   an insulative region (IR) to permit passage of light therethrough;
   a substrate region of a first conductivity type;
   a well region of a second conductivity type, formed within the substrate and beneath said IR, the well demarcated from the substrate by a first surface; and
   a heavily doped region (HDR) of said second conductivity type, formed within said IR at a first position, said first surface meeting said HDR at substantially the first position.

2. The photodiode of claim 1 wherein said heavily doped region is a guard ring including a diffusion formed within said IR.

3. The photodiode of claim 1 wherein said IR region has a substantially circular form.

4. The photodiode of claim 1 wherein said HDR region has a substantially annular form.

5. The photodiode of claim 1 wherein said IR region has a substantially rectangular shape, said HDR enclosing said IR.

6. The photodiode of claim 5, wherein said HDR region has a substantially rectangular loop-like form.

7. The photodiode of claim 1 wherein said HDR includes a loop that separates said IR into an internal region surrounded by said HDR and an external region surrounding said HDR.

8. The photodiode of claim 7 wherein said external region has a lateral surface in contact with said HDR.

9. The photodiode of claim 8 wherein a depletion region formed in the well and substrate, in the vicinity of said first surface, when said substrate and well are reversed biased, terminates at said lateral surface.

10. The photodiode of claim 7 wherein said loop has a first width and said internal region has a second width, a ratio of said first and second widths being in a range defined by first and second values.

11. The photodiode of claim 1 wherein said HDR includes a silicided top surface.

12. The photodiode of claim 1 wherein said IR region includes a shallow trench isolation region.

13. The photodiode of claim 1 wherein said HDR has a bottom surface that intersects said first surface.

14. An active pixel sensor array comprising:
   a photocell electrically responsive to light exposure, said photo cell including a photodiode that includes,
      a substrate region of a first conductivity type;
      an insulative region (IR), formed within the substrate, permitting passage of light therethrough;
      a well region of a second conductivity type, formed within the substrate and beneath said IR, the well being demarcated from the substrate by a first surface; and
      a heavily doped region (HDR) of said second conductivity type, formed within said IR at a first position, said first surface meeting said HDR at substantially the first position and reset circuitry coupled to said photodiode, to initialize the photodiode; and
   read out circuitry, coupled to the photodiode, to read an electrical signal representation of detected light.

15. A photodiode comprising:
   a semiconductor substrate region of a first conductivity type;
   an insulative region (IR), formed within the substrate, permitting passage of light therethrough
   a semiconductor well region of a second conductivity type, formed within the substrate and beneath said IR, the well demarcated from the substrate by a first surface; and
   a heavily doped region (HDR) of said second conductivity type, formed within said IR, said HDR surrounding a first portion of said IR to form a guard ring, said first surface intersecting said HDR.

16. The photodiode of claim 15 wherein said guard ring demarcates said first portion of said IR from a second portion of said IR that surrounds said first portion.

17. The photodiode of claim 15 wherein said substrate and well, when reverse biased, form a depletion region in the vicinity of said first surface.

18. The photodiode of claim 17 wherein said depletion region terminates at a lateral surface of said second portion.

19. The photodiode of claim 15 wherein said HDR includes a bottom surface and said first surface meets said HDR at said bottom surface.

20. The photodiode of claim 19 wherein said first surface intersects said bottom surface of said HDR at a location substantially positioned near a center of said bottom surface.

21. A photodiode comprising:
   a semiconductor substrate region of a first conductivity type;
   an electrically insulative region (IR), formed within the substrate, permitting passage of light therethrough, said IR having a first width;

a semiconductor well region of a second conductivity type, formed within the substrate and beneath said IR, said well having a second width larger than said first width, the well demarcated from the substrate by a first surface; and a gate oxide region formed upon the substrate and surrounding the IR, said first surface meeting said gate oxide.

22. An active pixel sensor array comprising;

a plurality of photodiodes, each photodiode including an insulative region (IR) to permit passage of light therethrough;

a substrate region of a first conductivity type;

a well region of a second conductivity type, formed within the substrate and beneath said IR, the well demarcated from the substrate by a first surface; and a heavily doped region (HDR) of said second conductivity type, formed within said IR at a first position, said first surface meeting said HDR at substantially the first position.

23. An imaging device comprising:

a control device;

an active pixel sensor array coupled to said control device including an insulative region (IR) to permit passage of light therethrough;

a substrate region of a first conductivity type;

a well region of a second conductivity type, formed within the substrate and beneath said IR, the well demarcated from the substrate by a first surface;

a heavily doped region (HDR) of said second conductivity type, formed within said IR at a first position, said first surface meeting said HDR at substantially the first position; and a post processing device coupled to said control device and to said active pixel sensor array.

* * * * *